United States Patent [19]

Prabhu et al.

[11] Patent Number: 4,619,836

[45] Date of Patent: Oct. 28, 1986

[54] METHOD OF FABRICATING THICK FILM ELECTRICAL COMPONENTS

[75] Inventors: Ashok N. Prabhu, East Windsor Township; Edward J. Conlon; Franco N. Sechi, both of Princeton Township, all of Mercer County, N.J.

[73] Assignee: RCA Corporation, Princeton, N.J.

[21] Appl. No.: 815,076

[22] Filed: Dec. 31, 1985

[51] Int. Cl.⁴ .............................................. H05K 3/12
[52] U.S. Cl. ........................................ 427/41; 427/96; 427/102; 427/103; 427/376.2; 427/376.3; 156/643
[58] Field of Search ............. 427/41, 96, 376.2, 376.3, 427/102, 103; 156/643

[56] References Cited

U.S. PATENT DOCUMENTS

| | | | |
|---|---|---|---|
| 3,935,330 | 1/1976 | Smith et al. | 427/41 |
| 4,201,579 | 5/1980 | Robinson et al. | 430/323 |
| 4,241,165 | 12/1980 | Hughes et al. | 430/269 |
| 4,278,753 | 7/1981 | Lewis et al. | 430/283 |
| 4,341,820 | 7/1982 | Taylor | 427/376.2 |
| 4,369,254 | 1/1983 | Prabhu | 427/96 |
| 4,511,601 | 4/1985 | Akse | 427/96 |
| 4,551,357 | 11/1985 | Takeuchi | 427/96 |
| 4,555,303 | 11/1985 | Legge | 156/643 |

OTHER PUBLICATIONS

M. Leahy, "Plasma Etching for Integrated Circuit Fabrication," RCA Engineer, 30-5, Sep./Oct. 1985, pp. 75-82.

*Primary Examiner*—John D. Smith
*Attorney, Agent, or Firm*—Birgit E. Morris

[57] ABSTRACT

A method is disclosed for fabricating thick film electrical components which are exceptionally uniform in electrical properties and have increased density wherein a thick film ink comprised of (i) an organic vehicle which is reactive with a plasma to form gaseous reaction products at a temperature below its thermal decomposition temperature, (ii) a glass frit having a glass transition temperature above the thermal degradation temperature, and (iii) a particulate material having the desired electrical properties for the thick film electrical component are applied to a suitable substrate in a pattern corresponding to the electrical component. The applied layer is then subjected to a suitable plasma at a temperature below the thermal degradation temperature for a time sufficient to remove the organic vehicle from the applied layer. The resultant layer is then heated at or above the glass transition temperature of the glass frit until the glass frit fuses and forms a composite with the particulate material.

6 Claims, No Drawings

METHOD OF FABRICATING THICK FILM ELECTRICAL COMPONENTS

This invention relates to a novel method for fabricating thick film electrical components having improved uniformity and increased density.

BACKGROUND OF THE INVENTION

The term "thick film electrical components" as used hereinafter refers to electrical components such as conductor lines, crossovers, resistors, capacitors and the like which are fabricated by applying a pattern of a suitable thick film ink on the surface of a substrate and then firing the thick film ink pattern to form the thick film electrical component.

The thick film inks which are conventionally used to form thick film electrical components are comprised of a glass frit, a finely divided particulate material having certain specified electrical properties and an organic vehicle. The thick film inks which are used for each type of electrical component are specially formulated so that the final fired composition will have certain predetermined electrical properties. For example, the thick film inks used to form conductor lines are typically comprised of from about 65 to 90% by weight of a highly conductive, finely divided, powdered material, such as powdered copper or gold, a fuseable glass frit and an organic vehicle. The crossover inks have a formulation which is similar to that of the conductor inks with the exception that they typically contain in place of the conductive metal powder an insulative oxide such as aluminum oxide or the like. The resistor inks are also similar to the conductor inks with the exception that they typically contain in place of the conductive metal powders various amounts of high resistivity oxide particles.

One of the major problems encountered in the manufacture of thick film electrical components is concerned with the removal of the organic vehicle prior to firing the glass frit. If the organic vehicle is not completely removed prior to firing, organic materials will be trapped in the fused glass frit and may decompose into carbonaceous materials. This can cause undesired changes in the electrical properties, such as nonuniform electrical conductivity, shorts and opens, as well as a generally overall lower density of the glass. Furthermore, when the substrate is refired, such as to form additional thick film electrical devices on the substrate, the organic residues remaining in the fired thick film electrical components may decompose into gases which then form bubbles, voids, or even holes completely through the fired thick film electrical component. These can likewise cause shorts or high resistance areas in the thick film electrical components.

The problem of removing all of the organic materials from the patterned glass layer prior to firing is especially difficult when the starting thick film composition contains readily oxidizable materials, such as particles of metallic copper or silver, in addition to the organic vehicle. The organics can be readily removed by heating at elevated temperatures of, for example, 400° to 500° C. in an oxidizing atmosphere. However, if a thick film composition containing highly oxidizable materials, such as copper as noted above, in addition to the organics is heated at an elevated temperature in an oxidizing atmosphere, the readily oxidizable materials will be simultaneously oxidized. The undesirable oxidation of certain of the materials in the thick film ink such as copper makes it extremely difficult to maintain the quality of the final product. The electrical conductivity of metals such as copper is substantially reduced if they are oxidized and it becomes extremely difficult to sinter the metal particles during the final firing step. The resulting oxides on the metal particles of the thick film components also substantially reduce the solderability of the fired thick film components.

In order to reduce the effects caused by firing in an oxidizing atmosphere it has been suggested to fire the thick film inks in non-oxidizing atmospheres, such as a nitrogen atmosphere, to limit the oxidation of the other materials in the ink. The use of a non-oxidizing atmosphere to remove the organic materials is both significantly more expensive and it is difficult to prevent at least some oxidation of the material due to the minor amounts of oxygen which are inherently present in the process. Furthermore, using a non-oxidizing atmosphere in which to heat the thick film inks to remove the organics is not completely satisfactory in that considerable amounts of the organics are thermally decomposed to carbonaceous materials which then remain in the final product causing shorts and the like as noted above.

It would be highly desirable if a method could be provided for effectively removing the organic vehicle from thick film inks after application and prior to firing so as to reduce or eliminate undesirable incorporation of organic materials in the final product and to improve the uniformity and density of the thick film electrical components which are formed.

SUMMARY OF THE INVENTION

A method is disclosed for fabricating thick film electrical components which are exceptionally uniform in electrical properties and have increased density. In the method which is disclosed a thick film ink comprised of (i) an organic vehicle which is reactive with a plasma to form gaseous reaction products at a temperature below its thermal decomposition temperature, (ii) a glass frit having a glass transition temperature of above the thermal degradation temperature, and (iii) a particulate material having the desired electrical properties for the thick film electrical component, are applied to a suitable substrate in a pattern corresponding to the desired electrical component. The applied layer of thick film ink is then subjected to a suitable plasma at a temperature below the thermal degradation temperature of the organic vehicle for a time sufficient to remove the organic vehicle from the layer. The layer is then heated to or above the glass transition temperature of the glass frit until the glass frit fuses and forms a composite with the particulate material.

DETAILED DESCRIPTION OF THE INVENTION

The thick film inks which are used in the method of this invention can readily be formulated from commercially available materials or can be purchased as thick film inks from various sources. The thick film inks which are used in this invention are comprised of an intimate mixture of an organic vehicle, a glass frit, and a particulate material having the electrical properties desired to be imparted to the final thick film electrical component.

The organic vehicle contains a binder to hold the glass frit and particulate materials together after application to a substrate. Resinous film-forming materials such as ethylcellulose, methylcellulose, polystyrene and the like are satisfactory for this purpose. A wetting agent is generally included in the organic vehicle to wet the surfaces of the glass frit and the particulate material as well as the surface of the substrate to promote good adhesion. The organic vehicle, in addition, includes a solvent to adjust the viscosity as required for the particular method of application to be employed to apply the thick film ink. All of the organic constituents of the organic vehicle are preferably selected so as to be completely convertible on reaction with a suitable plasma into gaseous reaction products, such as carbon dioxide, carbon monoxide, water, or low molecular weight hydrocarbon gases, at temperatures substantially below the thermal decomposition temperature of the organic vehicle. Ideally, the organic components of the organic vehicle, if not readily volatilized during drying as explained below, should have a thermal decomposition temperature of no higher than about 400° C.

The glass frit which is used should be chemically compatible with the reagents and processes to be employed in the manufacture of the thick film electrical component. The glass frit should have as small a particle size as feasible in order to ensure good particle packing on the surface of the substrate. The glass transition temperature of the frit should likewise be substantially higher than the thermal decomposition temperature of the organic vehicle and preferably should be about 700° to 1000° C.

The particulate material which is added to the thick film ink is selected based upon its electrical properties and its thermal and chemical compatibility with the other materials and processes involved in the manufacture of the thick film electrical component. The particular chemical type, particular size, and relative amounts of the particulate material required to obtain a thick film electrical component with predetermined electrical properties are well-known in the art or can readily be ascertained and accordingly are not discussed in detail herein.

The substrates which are employed are likewise conventional and include materials such as silicon dioxide, alumina, and procelain-coated metal boards.

To form the thick film electrical components a thick film ink composition having the required composition is applied on the surface of the substrate in a desired pattern such as by silk screening. The ink is then preferably dried at about 100° C. to remove the volatile materials.

The dried patterned thick film layer is then subjected to treatment with a plasma which reacts with the organic material in the layer to convert the organic material into gaseous products at a temperature below its thermal decomposition temperature and preferably at a temperature of between 100° and 150° C.

The plasma can be generated by using plasma reactors of various conventional well known designs. The plasma can be an oxidizing plasma formed using oxygen or a mixture of oxygen with an inert gas such as argon. The oxygen or oxygen-containing gas mixture is continually introduced into the plasma reactor and the gaseous reaction products are continually removed. The plasma readily penetrates the relatively porous layer of glass frit and particulate material on the substrate and react with the organic vehicle. The resulting reaction gases readily escape from the porous layer. The plasma reaction is continued until substantially all the organic vehicle is removed as indicated by a loss of weight of the substrate having the thick film layer formed thereon or by monitoring the exhaust gases until they are free of carbon-oxygen reaction gas products.

In an alternate embodiment of this invention, the organic material is removed with a reducing plasma, such as a plasma formed from hydrogen, water gas, or a mixture of hydrogen with an inert gas such as argon. A reducing plasma is particularly effective if there are oxidizable materials in the ink or if the thick film ink contains readily oxidizable materials such as copper, silver, or the like. The reducing plasma not only does not oxidize the oxidizable material but it removes their surface oxides. The reducing plasma reaction is continued until substantially all the organic vehicle is removed from the thick film layer on the substrate.

In an additional embodiment of this invention, a thick film ink layer which includes an organic vehicle which is readily removed, either by heating the layer to the thermal oxidation temperature of the organic vehicle or by subjecting the layer to an oxidizing plasma, and which also contains readily oxidizable materials such as metallic copper, can be higly successfully treated in accordance with this invention by including a separate reducing plasma step in the method. In this embodiment the readily oxidizable organic vehicle is initially removed by heating the layer in an oxidizing atmosphere up to the thermal degradation temperature of the organic vehicle and maintained there until all the organic vehicle is removed. The organic vehicle can also be removed by subjecting the thick film layer to an oxidizing plasma until all the organic vehicle is removed from the layer. The layer is then subjected to a reducing plasma, such as a hydrogen-containing plasma, until the oxidized particulate material is reduced to the metallic state. Then the residual layer of glass frit and the particulate material is fired in a nitrogen or other inert atmosphere.

The thick film layer after the plasma reaction is completed will consist substantially of a mixture of glass frit and the particulate material. Surprisingly, however, despite the removal of the organic vehicle the particles of the glass frit and the particulate material remain in position on the substrate. This may be due to a packing effect or may be the result of forces developed between the individual particles or a combination of both.

The substrate with the patterned thick film ink layer on the surface thereof is then fired at an elevated temperature above the thermal decomposition temperature of the organic vehicle, and at at least the glass transition temperature of the glass frit until the glass frit particles fuse together to form a thick film electrical component on the surface of the substrate.

The resulting thick film electrical component will be free of residual organic materials and the patterns of the thick film electrical components will be precisely defined. The surface of the resulting thick film electrical component is especially smooth and free from defects; the distribution of the particulate material through the fused glass frit is uniform; and the fused layer is free of voids and residual particles. Furthermore, upon refiring to form additional thick film electrical components over the substrate the thick film electrical component formed in accordance with this invention remains intact because gas bubbles and the like are not formed within the thick film electrical component.

What is claimed is:

1. A method for fabricating a thick film electrical component on the surface of a substrate comprising the steps of:

(a) providing a thick film ink composition comprised of (i) an organic vehicle which is reactive with a suitable plasma to form gaseous reaction products at a temperature below the thermal decomposition temperature of the organic vehicle, (ii) a glass frit having a glass transition temperature above the thermal decomposition temperature of the organic vehicle, and (iii) a particulate material for imparting a predetermined electrical property to the electrical component;

(b) forming a patterned layer of the thick film ink on the surface of the substrate;

(c) subjecting the layer to a suitable plasma at a temperature below the thermal decomposition temperature of the organic vehicle for a time sufficient to remove the organic vehicle from the layer; and (d) firing the resulting layer of glass frit and particulate material at or above the glass transition temperature of the glass frit until the glass frit fuses.

2. In the method according to claim 1 wherein the organic vehicle is reactive with an oxidizing plasma and said plasma is an oxygen-containing plasma.

3. In the method acording to claim 2 wherein the plasma is an oxygen plasma.

4. In the method according to claim 1 wherein the organic vehicle is reactive with a reducing plasma and said plasma is a hydrogen-containing plasma.

5. In the method according to claim 1 wherein the organic vehicle is reactive with an oxidizing plasma and the particulant material is readily oxidizable comprising after step (c) the step of subjecting the layer to a reducing plasma until the particulate material is in a substantially unoxidized state.

6. The method according to claim 5 wherein the organic vehicle is removed with an oxidizing plasma.

* * * * *